(12) United States Patent
Aoyagi et al.

(10) Patent No.: US 8,800,843 B2
(45) Date of Patent: Aug. 12, 2014

(54) BONDING APPARATUS

(75) Inventors: Nobuyuki Aoyagi, Tokyo (JP); Kohei Seyama, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 256 days.

(21) Appl. No.: 12/982,019

(22) Filed: Dec. 30, 2010

(65) Prior Publication Data

US 2011/0155789 A1  Jun. 30, 2011

Related U.S. Application Data

(63) Continuation of application No. PCT/JP2008/072969, filed on Dec. 17, 2008.

(30) Foreign Application Priority Data

Jun. 30, 2008 (JP) ................................. 2008-169797

(51) Int. Cl.
*B23K 1/06* (2006.01)

(52) U.S. Cl.
USPC .......................................................... 228/1.1

(58) Field of Classification Search
USPC .......................................................... 228/1.1
See application file for complete search history.

(56) References Cited

U.S. PATENT DOCUMENTS

| | | | |
|---|---|---|---|
| 5,431,324 A | 7/1995 | Kajiwara et al. | |
| 6,279,810 B1 | 8/2001 | Chan-Wong et al. | |
| 6,425,514 B1 * | 7/2002 | Ou et al. | ........................ 228/102 |
| 2008/0011809 A1 | 1/2008 | Seyama | |

FOREIGN PATENT DOCUMENTS

| | | |
|---|---|---|
| JP | 5-206224 | 8/1993 |
| JP | 10-256320 | 9/1998 |
| JP | 2001242022 | 9/2001 |
| JP | 2003-258021 | 9/2003 |
| JP | 3530139 | 5/2004 |
| JP | 2008-21839 | 1/2008 |

OTHER PUBLICATIONS

Machine translation of JP 2003-258021, published Sep. 2003.*
Machine translation of JP 10-256320, published Sep. 1998.*
International Search Report dated Feb. 10, 2009, from the corresponding International Application.

* cited by examiner

*Primary Examiner* — Nicholas P D'Aniello
(74) *Attorney, Agent, or Firm* — Katten Muchin Rosenman LLP

(57) ABSTRACT

A bonding apparatus includes an ultrasonic horn configured to vibrate longitudinally in resonance with the vibration of an ultrasonic vibrator; a capillary attached at an anti-node of the vibration of the ultrasonic horn; a flange provided at a node of the vibration of the ultrasonic horn; a bonding arm; a load sensor attached between the center of rotation of the bonding arm and a flange mounting surface; and a vibration load detection unit for extracting a signal obtained by causing a signal that is detected with the load sensor to pass a signal within a frequency range around the vibrational frequency of the ultrasonic vibrator through a band-pass filter, whereby the bonding apparatus can detect the vibration load at a tip end of the capillary in the direction along the central axis of the ultrasonic horn with a simple structure.

16 Claims, 6 Drawing Sheets

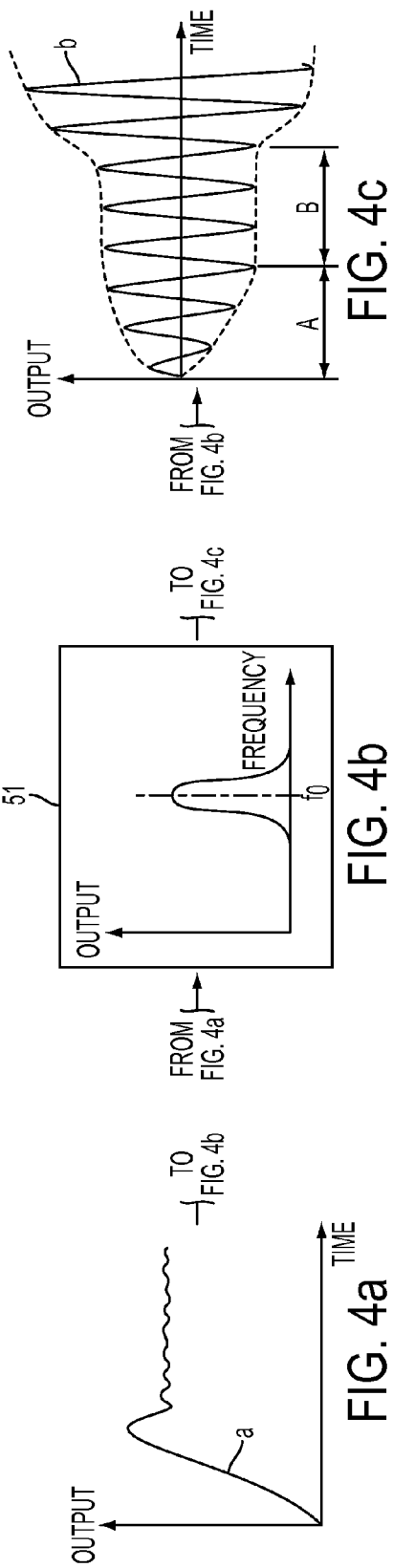

(a)

(b)

BONDING APPARATUS

BACKGROUND OF THE INVENTION

1. Field of the Invention

The present invention relates to a structure of a bonding apparatus.

2. Related Art

In semiconductor manufacturing processes, wire-bonding apparatuses are often used for bonding of thin metallic wires to electrode pads on a semiconductor chip and electrode leads on a lead frame for connection therebetween. Many wire-bonding apparatuses include a bonding arm configured to be rotated by a drive motor, an ultrasonic horn attached to the bonding arm, a capillary attached at one end of the ultrasonic horn, and an ultrasonic vibrator attached to the ultrasonic horn. In such wire-bonding apparatuses, the bonding arm is driven and rotated to move the capillary in a direction toward and away from a pad or lead and to bond an initial ball formed at a tip end of the capillary or a wire to the pad or lead, and then the ultrasonic horn is resonated with the ultrasonic vibrator to provide ultrasonic vibration at the tip end of the capillary for performing a bonding operation.

Such wire-bonding apparatuses also include a control unit for controlling the application of a current value to the drive motor and ultrasonic vibrator to provide a predetermined bonding load and ultrasonic output during bonding.

For successful bonding with such a wire-bonding apparatus, it is necessary to detect and feedback a bonding load, ultrasonic output, and the like provided from the capillary to pads and leads during bonding.

For this reason, Japanese Unexamined Patent Application Publication No. 10-256320 proposes attaching a strain gauge to an ultrasonic horn and, using this strain gauge, detecting a bonding load and ultrasonic vibration to control the application of a voltage to a drive motor and an ultrasonic vibrator.

Japanese Patent No. 3530139 also proposes providing a load detecting sensor and an ultrasonic vibration detecting sensor made of piezoelectric material on the same plane between a capillary and an ultrasonic vibrator, and detecting bonding load and ultrasonic vibration outputs from the respective sensors.

In contrast, the state of ultrasonic vibration at the tip end of the capillary varies at different times from the start of bonding, during bonding of an initial ball, to the end of the bonding of the initial ball, and the same applies to vibration loads at the tip end of the capillary. In this respect, the related arts described in Japanese Unexamined Patent Application Publication No. 10-256320 and Japanese Patent No. 3530139 can detect the change in the ultrasonic output of the ultrasonic horn itself, but not the change in the vibration at the tip end of the capillary, which is much smaller than that of the entire ultrasonic horn.

Also, in the related arts described in both Japanese Unexamined Patent Application Publication No. 10-256320 and Japanese Patent No. 3530139, the load sensor is attached at a site of the ultrasonic horn at which the amplitude of ultrasonic vibration emerges, suffering from a problem in that the sensor attached to the ultrasonic horn affects the ultrasonic vibration and thereby has some impact on the bonding performance. Further, changing the ultrasonic horn as appropriate also requires the sensor to be changed, suffering from a problem of taking a long time for maintenance because it is necessary to make an adjustment such as a calibration at every change of the ultrasonic horn.

BRIEF SUMMARY OF THE INVENTION

It is hence an object of the present invention to detect a vibration load at a tip end of a bonding tool in a simply structured bonding apparatus.

The present invention is directed to a bonding apparatus including: a base unit; an ultrasonic horn configured to vibrate longitudinally in resonance with the vibration of an ultrasonic vibrator; a bonding tool attached at an anti-node of the vibration of the ultrasonic horn; a flange provided at a node of the vibration of the ultrasonic horn; a bonding arm including a flange mounting surface at which the flange is fixed to the ultrasonic horn and attached rotatably to the base unit in such a manner as to move a tip end of the bonding tool in a direction toward and away from a bonding target; a load sensor attached between the center of rotation of the bonding arm and the flange mounting surface; and a vibration load detection unit for extracting a signal obtained by causing a signal that is detected with the load sensor to pass a signal within a frequency range around the vibrational frequency of the ultrasonic vibrator through a filter that is able to pass the signal within the frequency range around the vibrational frequency of the ultrasonic vibrator and, based on the extracted signal, thereby detecting a vibration load at the tip end of the bonding tool in the longitudinal direction of the ultrasonic horn.

The bonding apparatus according to the present invention can preferably be arranged such that the vibration load detection unit includes bonding state determination means for determining the state of bonding between an initial ball formed at the tip end of the bonding tool and the bonding target based on the change in the amplitude of the detected vibration load at the tip end of the bonding tool in the longitudinal direction of the ultrasonic horn and to thereby output a bonding state signal. The bonding state determination means in the vibration load detection unit can preferably be configured to determine, after the start of bonding, that a period of amplitude increase during which the amplitude of the vibration load at the tip end of the bonding tool in the longitudinal direction of the ultrasonic horn increases and a period of amplitude stability after the period of amplitude increase during which the amplitude is approximately constant are in a mid-bonding state in which the initial ball formed at the tip end of the bonding tool is deformed and bonded to the bonding target and to thereby output a mid-bonding state signal, while to determine that the bonding is completed when a predetermined period of time passes after the amplitude becomes larger than the amplitude during the period of amplitude stability and to thereby output a bonding completion signal.

The bonding apparatus according to the present invention can preferably further include a control unit connected with the vibration load detection unit to change the output of the ultrasonic vibrator, in which the control unit includes ultrasonic vibration stop means for stopping the output of the ultrasonic vibrator when the bonding completion signal is input from the vibration load detection unit.

The control unit can preferably further include ultrasonic vibration change means for making the output of the ultrasonic vibrator greater than a preset output when the amplitude during the period of amplitude stability detected by the vibration load detection unit is smaller than a predetermined value, while making the output of the ultrasonic vibrator smaller than the preset output when the amplitude during the period of amplitude stability is larger than the predetermined value.

The present invention offers the advantage of detecting a vibration load at a tip end of a bonding tool in a simply structured bonding apparatus.

BRIEF DESCRIPTION OF THE SEVERAL VIEWS OF THE DRAWINGS

Exemplary embodiments of the present invention will be described in detail based on the following figures, wherein:

FIG. 4 illustrates signal processing at a vibration load detection unit in the wire-bonding apparatus according to an exemplary embodiment of the present invention;

DETAILED DESCRIPTION OF THE INVENTION

Figure 1:
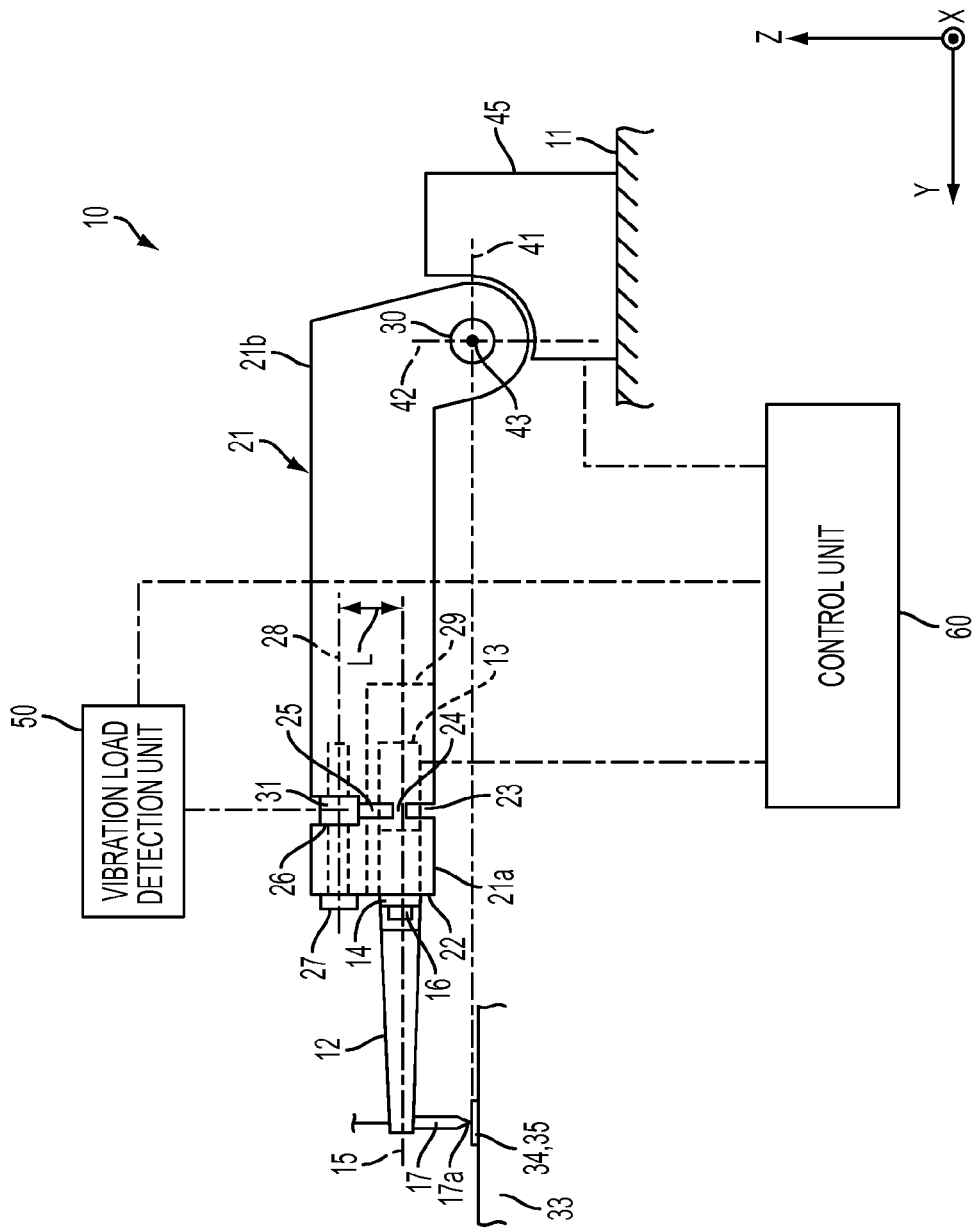
FIG. 1 illustrates a wire-bonding apparatus according to an exemplary embodiment of the present invention.

Exemplary embodiments of the present invention will hereinafter be described in detail with reference to the accompanying drawings. As shown in FIG. 1, a wire-bonding apparatus 10 according to this exemplary embodiment includes a bonding head 11 serving as a base unit, an ultrasonic vibrator 13, an ultrasonic horn 12, a capillary 17 serving as a bonding tool, a flange 14 provided on the ultrasonic horn 12, a bonding arm 21, a load sensor 31, a drive motor 45, a vibration load detection unit 50, a control unit 60, and a bonding stage 33 on which a semiconductor chip 34 or a substrate 35 is absorbed and fixed as a bonding target.

The drive motor 45 for rotating the bonding arm 21 is provided on the bonding head 11. The ultrasonic vibrator 13 is formed by overlaying multiple piezoelectric elements and attached at the rear end of the ultrasonic horn 12. The capillary 17 is attached at one end of the ultrasonic horn 12. The flange 14 is provided at a node of the vibration of the ultrasonic horn 12 to be described hereinafter and fixed using a bolt 16 to a flange mounting surface 22 at one end of the bonding arm 21.

The bonding arm 21 is attached rotatably about a rotation axis 30 provided on the bonding head 11. The center of rotation 43 of the bonding arm 21 is coplanar with the surface of the substrate 35 absorbed on the bonding stage 33 or the surface of the semiconductor chip 34 mounted on the substrate 35.

The bonding arm 21 has an approximately rectangular parallelepiped shape extending in a direction along the central axis 15 of the ultrasonic horn 12, and has a front end portion 21a including the flange mounting surface 22 and a rear end portion 21b including the center of rotation 43. The front and rear end portions 21a and 21b are connected via a thin plate-like connection 24 provided at a height position (in the Z direction) including the central axis 15 of the ultrasonic horn 12. Between the front and rear end portions 21a and 21b of the bonding arm 21, narrow slits 23 and 25 are formed, respectively, on the side of the bonding surface 41 and its opposite side with respect to the connection 24. In a Z-directional upper part of the bonding arm 21 on the opposite side of the bonding surface 41, there is provided a groove 26 for fitting the load sensor 31 therein. The groove 26 is provided in an opposed manner between the front and rear end portions 21a and 21b of the bonding arm 21. The load sensor 31 fitted in the groove 26 is configured to sandwich between the front and rear end portions 21a and 21b of the bonding arm 21, so that the load sensor is pressurized with screws 27 inserted through the front end portion 21a into the rear end portion 21b. The central axis 28 of the load sensor 31 is offset from the central axis 15 of the ultrasonic horn 12 by a distance of L in the Z direction, a direction in which the tip end 17a of the capillary 17 moves toward and away from the bonding surface 41.

Figure 2A:
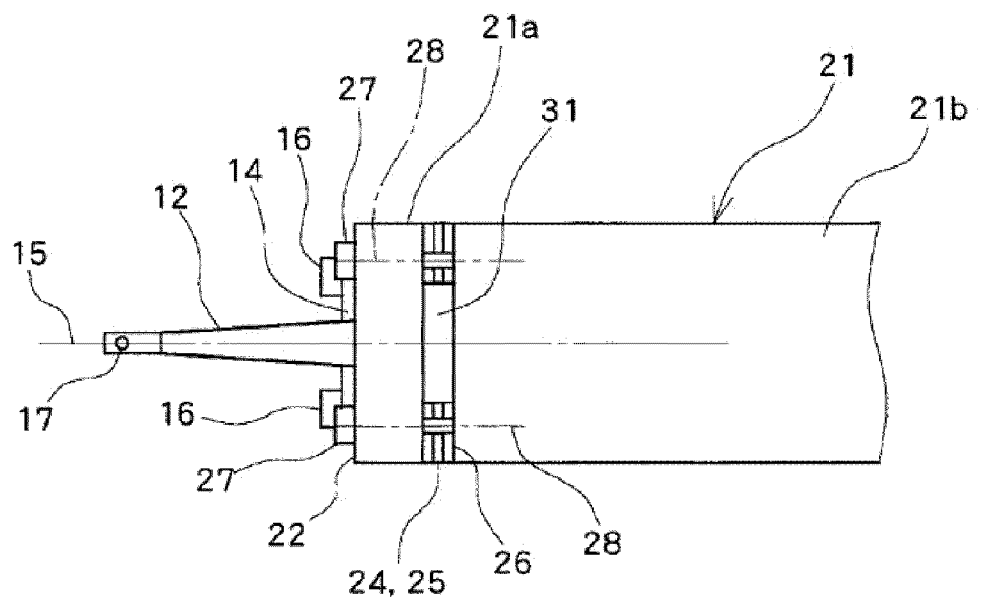
FIG. 2A is a top plan view of a bonding arm in the wire-bonding apparatus according to an exemplary embodiment of the present invention.
Figure 2B:
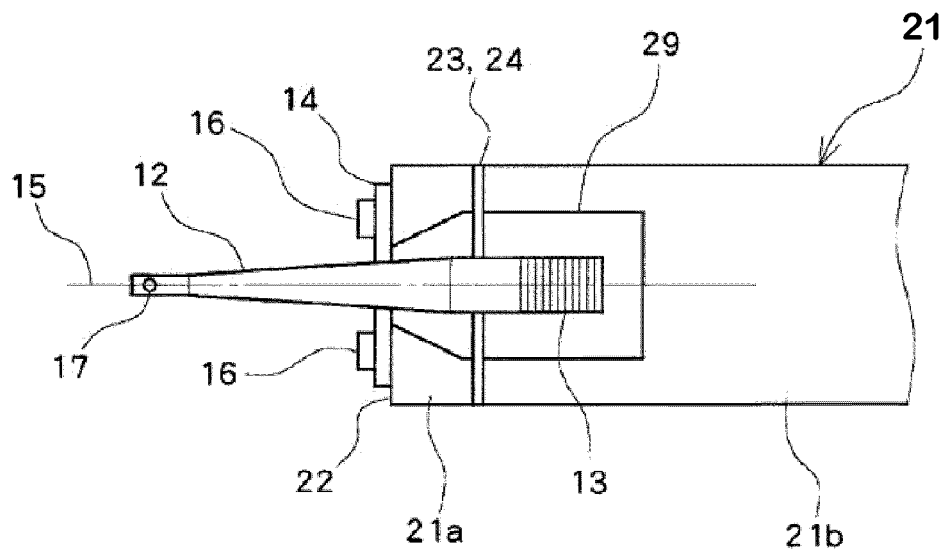
FIG. 2B is a bottom plan view of a bonding arm in the wire-bonding apparatus according to an exemplary embodiment of the present invention.

As shown in FIG. 2A, the load sensor 31 is mounted at the center in the width direction of the bonding arm 21, and the screws 27 are provided on either side of the load sensor 31. As shown in FIG. 2B, a recess 29 for housing the ultrasonic horn 12 and ultrasonic vibrator 13 therein is provided on the side of the bonding surface 41 in the bonding arm 21.

Figure 3A:
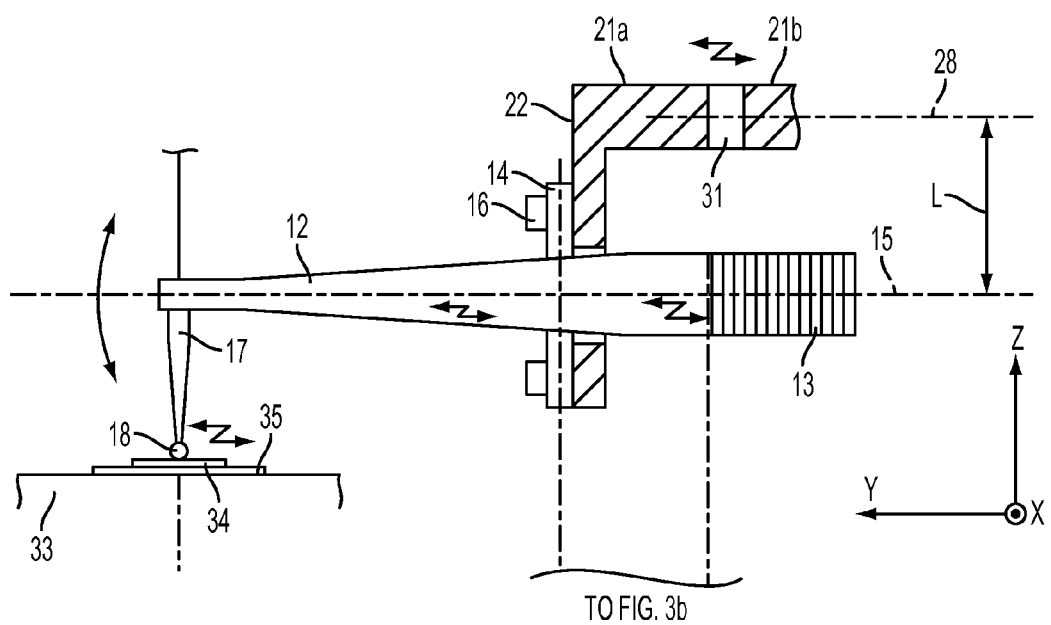
FIG. 3 is a schematic view illustrating ultrasonic vibration in the wire-bonding apparatus according to an exemplary embodiment of the present invention.
Figure 3B:
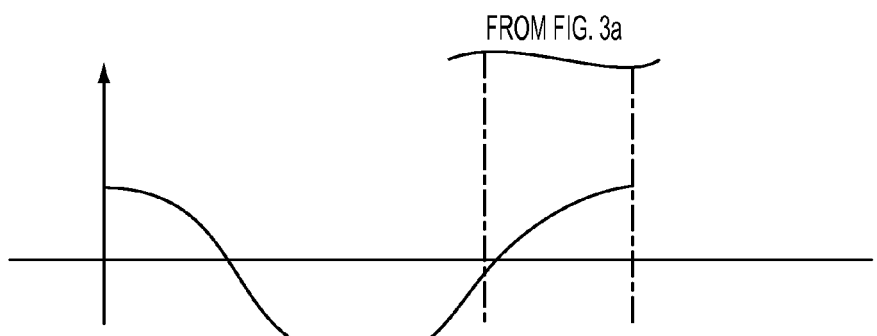

As shown in FIG. 3, the ultrasonic horn 12 is configured to vibrate in a longitudinal direction along the central axis 15 in resonance with the ultrasonic vibrator 13. Longitudinal vibration here means that the direction of propagation of the vibration and the direction of its amplitude are identical. As schematically shown in FIG. 3, the vibration of the ultrasonic vibrator 13 that is attached to the rear end of the ultrasonic horn 12 causes the ultrasonic horn 12 to vibrate between the rear end at which the ultrasonic vibrator 13 is attached and the front end at which the capillary 17 is attached in a resonant mode in which anti-nodes of the vibration are formed at the rear and front ends. The flange 14 is then provided at a node of the vibration between the rear and front ends, that is, a site that does not vibrate even in a resonant state to fix the ultrasonic horn 12 to the bonding arm 21. The flange 14 is fixed using the bolt 16 to the flange mounting surface 22 on the bonding arm 21. Since the flange 14 does not vibrate with the resonance of the ultrasonic horn 12, ultrasonic vibration due to the resonance of the ultrasonic horn 12 does not propagate to the flange mounting surface 22 on the bonding arm 21. Therefore, the ultrasonic vibration due to the resonance of the ultrasonic horn 12 does not also propagate to the load sensor 31 provided on the bonding arm 21. It is noted that FIG. 3 is a schematic view illustrating the relationship among the bonding arm 21, ultrasonic horn 12, flange 14, and bolt 16, where the flange 14, which extends horizontally in the XY direction from the ultrasonic horn 12, is drawn vertically. Also, FIG. 3 (b) schematically illustrates the amplitude of the ultrasonic horn 12, where the amplitude in the direction along the central axis 15 is drawn as orthogonal to the central axis 15.

As shown in FIG. 1, the vibration load detection unit 50 is configured to contain a band-pass filter through which a signal within a frequency range around the vibrational frequency of the ultrasonic vibrator passes, and is connected with the load sensor 31, so that the vibration load at the tip end 17a of the capillary 17 in the direction along the central axis 15 of the ultrasonic horn 12 can be detected based on a signal detected with the load sensor 31. In addition, the ultrasonic vibrator 13, drive motor 45, and vibration load detection unit 50 are configured to connect to the control unit 60, so that the control unit 60 can control the output of the ultrasonic vibrator 13 and the direction of rotation as well as output of the drive motor 45. The control unit 60 also receives the vibration load detected by operating the vibration load detection unit 50.

The vibration load detection unit 50 and the control unit 60 are configured to contain a computer having a CPU, memory, etc. Alternatively, the detection and control systems are configured to include an electric circuit.

Next will be described the operation of detecting a vibration load at the tip end 17a of the capillary 17 in the direction along the central axis 15 of the ultrasonic horn 12 during bonding using the thus configured wire-bonding apparatus 10.

The control unit 60 shown in FIG. 1 forms a tip end of a wire extending out of the tip end 17a of the capillary 17 into a spherical initial ball 18 using, for example, a discharge torch (not shown). The control unit 60 then issues a command to drive the drive motor 45. Receiving this command, the drive motor 45 starts to rotate and lower the capillary 17 onto the semiconductor chip 34. The control unit 60 also issues a command to start the vibration of the ultrasonic vibrator 13. Receiving this command, the ultrasonic vibrator 13 is applied with a voltage for a vibration output preset correspondingly to bonding conditions.

Before the initial ball 18 formed at the tip end of the capillary 17 comes into contact with the surface of the semiconductor chip 34, the ultrasonic horn 12 is in resonance with the vibration of the ultrasonic vibrator 13 and vibrates longitudinally with anti-nodes of the vibration being formed at the front end where the capillary 17 is attached and the rear end where the ultrasonic vibrator 13 is attached, as shown in FIG. 3. The flange 14, which is arranged at a node of the vibration, does not vibrate with the resonance of the ultrasonic horn 12 and thus the load sensor 31 detects no load.

When the bonding arm 21 is lowered and the initial ball 18 comes into contact with a pad on the semiconductor chip 34, the capillary 17 starts to press the initial ball 18 against the pad. Then, the Z-directional pressing force on the capillary 17 applies a bending moment to the ultrasonic horn 12. This bending moment transfers from the flange 14 to the front end portion 21a of the bonding arm 21. The front end portion 21a of the bonding arm 21 then starts to rotate clockwise about the thin plate-like connection 24 serving as a rotation hinge. This rotational moment compresses the load sensor 31, and the load sensor 31 starts to detect the vertical load of the capillary 17.

Figure 5A:
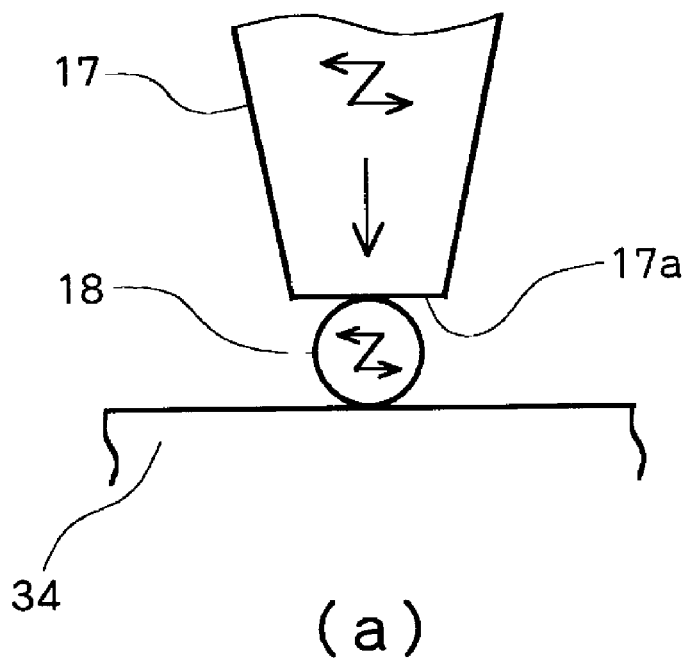
FIG. 5A illustrates a change in the state of an initial ball during bonding in the wire-bonding apparatus according to an exemplary embodiment of the present invention.

As shown in FIG. 5A, since the capillary 17 vibrates in the direction along the central axis 15 of the ultrasonic horn 12 with the vibration of the ultrasonic horn 12, when the initial ball 18 is in contact with the pad on the semiconductor chip 34, there occurs a frictional force between the pad and the initial ball 18. This frictional force causes a vibration load to be applied at the tip end 17a of the capillary 17. The vibration load transfers through the capillary 17 to cause the entire ultrasonic horn 12 to vibrate in the direction along the central axis 15, and thus also cause the flange 14, to which vibration due to the resonance of the ultrasonic horn 12 cannot propagate, to vibrate likewise in the direction along the central axis 15. This also causes the flange mounting surface 22 on the bonding arm 21 to vibrate likewise in the direction along the central axis 15 of the ultrasonic horn 12, and the vibration load is detected with the load sensor 31. In this case, the frequency of the resonance in the direction along the central axis 15 of the ultrasonic horn 12 is approximately the same as that of the vibration at the tip end 17a of the capillary 17 in the direction along the central axis 15 of the ultrasonic horn 12.

Since the vibration load at the tip end 17a of the capillary 17 in the direction along the central axis 15 of the ultrasonic horn 12 is much smaller than the vertical load at the tip end of the capillary 17 in the Z direction orthogonal to the central axis 15 of the ultrasonic horn 12, the load detected with the load sensor 31 is almost a vertical load signal, as shown in FIG. 4 (a). In contrast, the frequency of the vibration load at the tip end 17a of the capillary 17 in the direction along the central axis 15 of the ultrasonic horn 12 is approximately the same as that of the vibration of the ultrasonic horn 12. Therefore, by extracting a signal only within a frequency range around the vibrational frequency $f_0$ of the ultrasonic horn 12 through a narrowband filter 51 with a central frequency at the vibrational frequency of the ultrasonic horn 12, the narrowband filter 51, which is included in the vibration load detection unit 50 as shown in FIG. 4 (b), a signal representing the vibration load at the tip end 17a of the capillary 17 in the direction along the central axis 15 of the ultrasonic horn 12 can be extracted from the output of the load sensor 31 as shown in FIG. 4 (c). The magnitude of the vibration load can then be detected based on the amplitude of the extracted signal.

Next will be described ultrasonic vibration stop means and ultrasonic vibration change means for detecting the change in the bonding state between the initial ball 18 and the pad on the semiconductor chip 34 and for adjusting the output of the ultrasonic vibrator 13 during bonding based on the thus detected vibration load.

Figure 6:
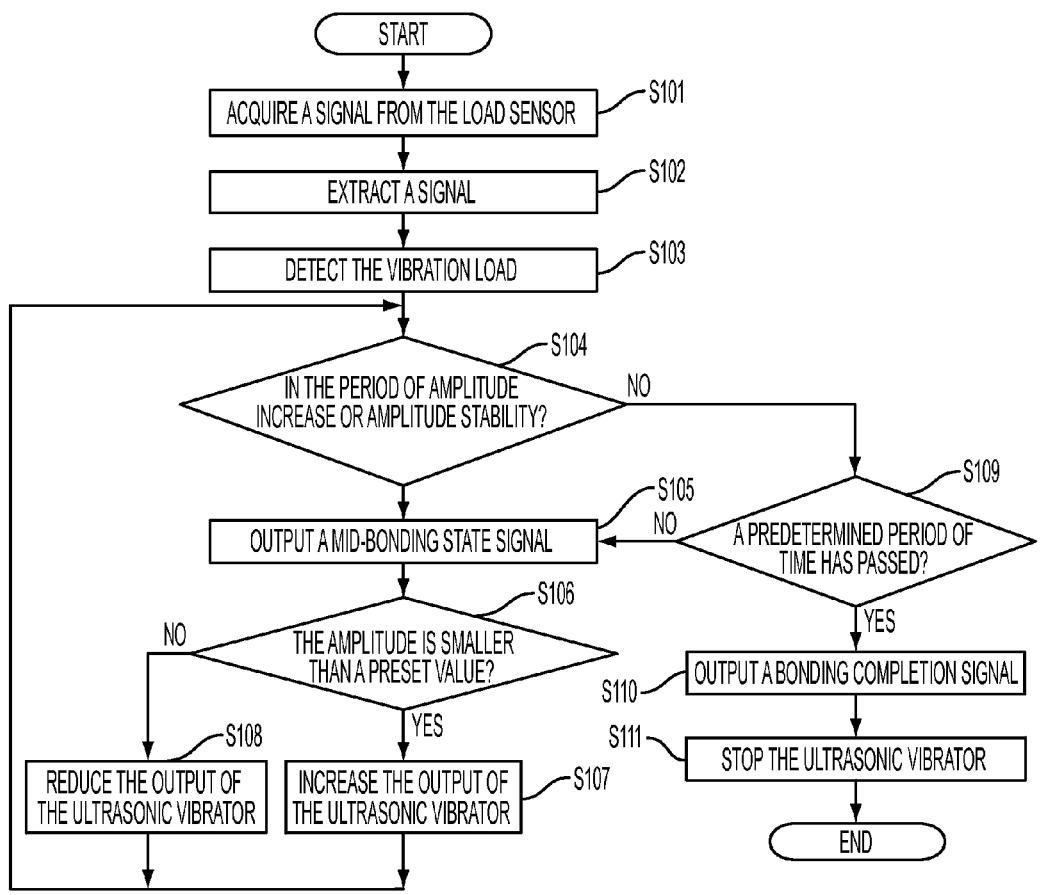
FIG. 6 is a flow chart illustrating an output adjustment for an ultrasonic vibrator in the wire-bonding apparatus according to an exemplary embodiment of the present invention.

Upon the start of a bonding operation, the vibration load detection unit 50 acquires a signal from the load sensor 31 as shown in Step S101 of FIG. 6. The detected signal is then applied through the narrowband filter 51 to extract a signal only within a frequency range around the vibrational frequency of the ultrasonic horn 12 as shown in Step S102 of FIG. 6, and thus detect the vibration load as shown in Step S103 of FIG. 6.

Figure 5B:
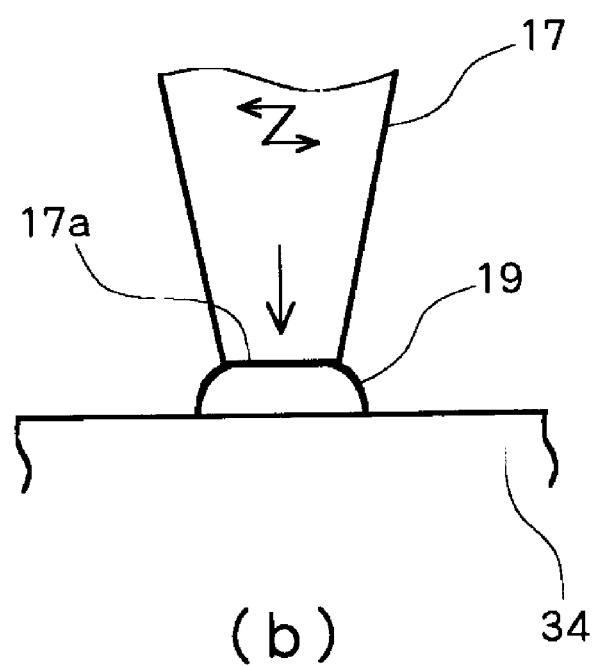
FIG. 5B illustrates a further change in the state of the initial ball during bonding in the wire-bonding apparatus according to an exemplary embodiment of the present invention.

When the initial ball 18 at the tip end 17a of the capillary 17 comes into contact with the pad on the semiconductor chip 34 as shown in FIG. 5A, the vibration load in the direction along the central axis 15 of the ultrasonic horn 12 starts to be applied between the initial ball 18 and the pad. As indicated by the time period A in FIG. 4 (c), the amplitude of the vibration load extracted through the narrowband filter 51, which is zero before the contact of the initial ball 18, increases as the initial ball 18 is pressed against the pad with the tip end 17a of the capillary 17, because the vertical load of the capillary 17 increases. As indicated by the time period B in FIG. 4 (c), when the initial ball 18 is deformed in accordance with the shape of the tip end 17a of the capillary 17, the amplitude of the vibration load stops increasing to remain unchanged for a while. When the initial ball 18 is then bonded to the pad on the semiconductor chip 34 to be a bonded ball 19 as shown in FIG. 5B, the tip end 17a of the capillary 17 is limited to move in the direction along the central axis 15 of the ultrasonic horn 12, so that the vibration load increases again. The time period A in FIG. 4 (c) is a period of amplitude increase and the time period B in FIG. 4 (c) is a period of amplitude stability.

The vibration load detection unit 50 determines if the detected vibration load is in the period of amplitude increase during which the amplitude thereof increases from zero or in the period of amplitude stability. As for the period of amplitude increase, the determination can be made by calculating the rate of increase in the amplitude to time and confirming that the rate of increase is greater than a threshold value. As for the period of amplitude stability, the determination can be made by confirming that the rate of change in the amplitude to time is greater than a threshold value and the amplitude lies between upper and lower threshold values.

If the vibration load detection unit 50 determines, as shown in Step S104 of FIG. 6, that the change in the amplitude of the vibration load at the capillary 17 in the direction along the central axis 15 of the ultrasonic horn 12 during bonding is in the period of amplitude increase or in the period of amplitude stability, outputs a mid-bonding state signal that indicates the bonding is in a mid-state, as shown in Step S105 of FIG. 6. In contrast, if the vibration load detection unit 50 determines that the change in the amplitude of the vibration load at the capillary 17 in the direction along the central axis 15 of the ultrasonic horn 12 is neither in the period of amplitude increase nor in the period of amplitude stability, further determines if a predetermined period of time has passed, as shown in Step S109 of FIG. 6. Before the predetermined period of time passes, the vibration load detection unit 50 outputs a mid-bonding state signal as shown in Step S105 of FIG. 6. If the vibration load detection unit 50 determines that the change in the amplitude of the vibration load at the capillary 17 in the direction along the central axis 15 of the ultrasonic horn 12 is neither in the period of amplitude increase nor in the period of amplitude stability and that the predetermined period of time has passed, outputs a bonding completion signal, as shown in Step S110 of FIG. 6.

When the control unit 60 connected with the vibration load detection unit 50 receives the mid-bonding state signal from the vibration load detection unit 50, it makes a comparison between the amplitude of the detected vibration load and a preset vibration load amplitude corresponding to the output of the ultrasonic vibrator 13 as shown in Step S106 of FIG. 6. If the amplitude of the detected vibration load is smaller than the preset vibration load amplitude corresponding to the output of the ultrasonic vibrator 13, the control unit 60 determines that the output of the ultrasonic vibrator 13 runs short during bonding and, as shown in Step S107 of FIG. 6, increases the output of the ultrasonic vibrator 13. In contrast, if the amplitude of the detected vibration load is larger than the preset vibration load amplitude corresponding to the output of the ultrasonic vibrator 13, the control unit 60 determines that the output of the ultrasonic vibrator 13 is excessive during bonding and, as shown in Step S108 of FIG. 6, reduces the output of the ultrasonic vibrator 13 (ultrasonic vibration change means).

When the control unit 60 receives the bonding completion signal from the vibration load detection unit 50, it determines that the bonding of the initial ball 18 is completed and there is no need for ultrasonic vibration with the ultrasonic vibrator 13 and, as shown in Step S111 of FIG. 6, disconnects the voltage supply to the ultrasonic vibrator 13 to stop the ultrasonic vibrator 13 (ultrasonic vibration stop means).

As described above, the wire-bonding apparatus 10 according to the exemplary embodiment can detect a vibration load at the tip end 17a of the capillary 17 during bonding with a simple structure, offering the advantage that the behavior of the capillary 17 can be confirmed continuously during the bonding. In this exemplary embodiment, it is also possible to determine the state of bonding between the initial ball 18 and the bonding target during bonding, offering the advantage that the bonding quality can be improved by increasing or reducing the output of the ultrasonic vibrator 13 depending on the state of bonding to adequately control the bonding conditions. It is further possible to determine the completion of the bonding based on the change in the vibration load at the tip end 17a of the capillary 17 and, immediately after the completion of the bonding, to stop the output of the ultrasonic vibrator 13 to move on to the next step, offering the advantage that the bonding can be performed more accurately and the bonding time can be shortened.

In addition, it is also possible to immediately recognize the occurrence of abnormal vibration by continuously comparing the change in the detected vibration load at the tip end 17a of the capillary 17 with the change in the vibration load in a normal state, offering the advantage that bonding abnormalities can be detected.

Although a narrowband band-pass filter with a central frequency at the frequency of ultrasonic vibration is employed as a filter for extracting a signal only within a frequency range around the vibrational frequency of the ultrasonic horn 12 from the signal of the load sensor 31 in the description of this exemplary embodiment, low-pass and high-pass filters with a cut-off frequency around the frequency of ultrasonic vibration can be combined to extract a signal only within a frequency range around the vibrational frequency of the ultrasonic horn 12.

Although a wire-bonding apparatus is exemplified in the description of the embodiments, the present invention can be applied not only to wire-bonding apparatuses but also to other kinds of bonding apparatuses such as bump-bonding apparatuses.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A bonding apparatus comprising:
    a base unit;
    an ultrasonic horn vibrating longitudinally in resonance with a vibration of an ultrasonic vibrator, the ultrasonic horn comprising
        a bonding tool attaching portion,
        an ultrasonic horn body comprising a first location coinciding with a node of a resonant vibration and a second location coinciding with an anti-node of the resonant vibration, and
        a flange provided at the first location;
    a bonding tool attached at the second location;
    a bonding arm attached rotatably to the base unit in such a manner as to move a tip end of the bonding tool in a direction toward and away from a bonding target, the bonding arm comprising
        a front end portion having a flange mounting surface at which the flange of the ultrasonic horn is securely affixed to the bonding arm,
        a rear end portion having a center of rotation,
        a load sensor attached between the flange mounting surface and the center of rotation, and
        a thin plate-like connection positioned between two narrow slits functioning as a rotation hinge is formed between the front end portion and the rear end portion;
    a vibration load detection device comprising a filter and a computer for determining the bonding state;

said load sensor detecting a vibration load at the tip end of the bonding tool in a longitudinal direction of the ultrasonic horn;

said filter passing a signal within a frequency range around a frequency of the ultrasonic vibrator once said load sensor detects the vibration load, said computer determining after the start of bonding, a period of amplitude increase during which the amplitude of the vibration load at the tip end of the bonding tool in the longitudinal direction of the ultrasonic horn increases, and a period of amplitude stability after the period of amplitude increase during which the amplitude is approximately constant, said periods representing a mid-bonding state in which an initial ball formed at the tip end of the bonding tool is deformed and bonded to the bonding target, and in response to determining such periods, the computer outputs a mid-bonding state signal, said computer further determining that the bonding is completed upon detecting a predetermined period of time after detecting the amplitude becoming larger than the amplitude during the period of amplitude stability, the computer then outputting a bonding completion signal, the computer further determining the state of bonding between the initial ball formed at the tip end of the bonding tool and the bonding target based on detecting a change in the amplitude of the detected vibration load at the tip end of the bonding tool in the longitudinal direction of the ultrasonic horn, and thereafter outputting a signal based on the state of bonding.

2. The bonding apparatus according to claim 1, further comprising a control device connected with the vibration load detection-device to change an output of the ultrasonic vibrator, wherein the control-device comprises a vibration stop circuit for stopping the output of the ultrasonic vibrator when the bonding completion signal is input from the vibration load detection device.

3. The bonding apparatus according to claim 1, wherein the control device further comprises an ultrasonic vibration change device for making the output of the ultrasonic vibrator greater than a preset output when the amplitude during the period of amplitude stability detected by the vibration load detection device is smaller than a predetermined value, while making the output of the ultrasonic vibrator smaller than the preset output when the amplitude during the period of amplitude stability is larger than the predetermined value.

4. The bonding apparatus according to claim 2, wherein the control device further comprises ultrasonic vibration change device for making the output of the ultrasonic vibrator greater than a preset output when the amplitude during the period of amplitude stability detected by the vibration load detection device is smaller than a predetermined value, while making the output of the ultrasonic vibrator smaller than the preset output when the amplitude during the period of amplitude stability is larger than the predetermined value.

5. The bonding apparatus according to claim 1, wherein a load applied at the tip end of the bonding tool is magnified by a ratio of L1 to L2, L1 being a distance from the bonding tool to the thin plate-like connection in the longitudinal direction, L2 being a distance from the central axis of the ultrasonic horn to the central axis of the load sensor in a Z axis.

6. The bonding apparatus of claim 1, wherein the thin plate-like connection is located immediately below the load sensor.

7. The bonding apparatus of claim 5, wherein the thin plate-like connection is located immediately below the load sensor.

8. A bonding apparatus comprising:
a base unit;
a bonding arm having a first attachment to the base unit and a second attachment to the ultrasonic horn, the bonding arm rotating relative to the base unit about a center of rotation;
an ultrasonic vibrator for producing a vibration;
the ultrasonic horn vibrating longitudinally in resonance with the vibration, the ultrasonic horn having a first location coincident with a node of a resonant vibration and having a second location coincident with an anti-node of the resonant vibration;
a flange connected at the first location and connecting the ultrasonic horn to the bonding arm at the first location;
a bonding tool comprising a tip end moving toward and from a bonding target, the bonding tool attached to the second location;
a load sensor for detecting a vibration load at the tip end in a longitudinal direction of the ultrasonic horn, the load sensor disposed entirely between the first and second attachments; and
a vibration load detection device comprising a filter and a computer for determining a bonding state;
wherein the bonding arm comprises a forward end portion and a rear end portion joined to each other by a thin plate-like connection between two narrow slits functioning as a rotational hinge.

9. The bonding apparatus of claim 8, wherein the filter passes a signal within a frequency range around a frequency of the ultrasonic vibrator once the load sensor detects the vibration load.

10. The bonding apparatus of claim 9, wherein the computer determines after the start of bonding, a period of amplitude increase during which the amplitude of the vibration load at the tip end of the bonding tool in the longitudinal direction of the ultrasonic horn increases, and a period of amplitude stability after the period of amplitude increase during which the amplitude is approximately constant, said periods representing a mid-bonding state in which an initial ball formed at the tip end of the bonding tool is deformed and bonded to the bonding target, and in response to determining such periods, the computer outputs a mid-bonding state signal, said computer further determining that the bonding is completed upon detecting a predetermined period of time after detecting the amplitude becoming larger than the amplitude during the period of amplitude stability, the computer then outputting a bonding completion signal, the computer further determining the state of bonding between the initial ball formed at the tip end of the bonding tool and the bonding target based on detecting a change in the amplitude of the detected vibration load at the tip end of the bonding tool in the longitudinal direction of the ultrasonic horn, and thereafter outputting a signal based on the state of bonding.

11. The bonding apparatus of claim 8, wherein the first attachment is offset from a central axis of the bonding arm.

12. The bonding apparatus of claim 8, wherein tip end moves arcuately toward and from the bonding target.

13. The bonding apparatus of claim 8, wherein the first attachment comprises a distal end of the bonding arm.

14. The bonding apparatus of claim 8, wherein the bonding arm comprises a groove for receiving the load sensor.

15. The bonding apparatus of claim 8, wherein the tip end moving toward and from a bonding target is in a first direction the ultrasonic horn comprises a first central axis and the load sensor comprises a second central axis, the second central axis being offset from the first central axis in the first direction.

16. A bonding apparatus comprising:
- a base unit;
- a bonding arm having a first attachment to the base unit and a second attachment to the ultrasonic horn, the bonding arm rotating relative to the base unit about a center of rotation;
- an ultrasonic vibrator for producing a vibration;
- the ultrasonic horn vibrating longitudinally in resonance with the vibration, the ultrasonic horn having a first location coincident with a node of a resonant vibration and having a second location coincident with an anti-node of the resonant vibration;
- a flange connected at the first location and connecting the ultrasonic horn to the bonding arm at the first location;
- a bonding tool comprising a tip end moving toward and from a bonding target in a first direction, the bonding tool attached to the second location;
- a load sensor for detecting a vibration load at the tip end in a longitudinal direction of the ultrasonic horn, the load sensor disposed on a side of the bonding arm; and
- a vibration load detection device comprising a filter and a computer for determining a bonding state;
- wherein the ultrasonic horn comprises a first central axis and the load sensor comprises a second central axis, the second central axis being offset from the first central axis in the first direction;
- wherein the bonding arm comprises a forward end portion and a rear end portion joined to each other by a thin plate-like connection between two narrow slits functioning as a rotational hinge.

* * * * *